(12) United States Patent
Chen et al.

(10) Patent No.: US 11,362,236 B2
(45) Date of Patent: Jun. 14, 2022

(54) QUANTUM DOT AND MANUFACTURING METHOD FOR THE SAME AND APPLICATION USING THE SAME

(71) Applicant: Chi Mei Corporation, Tainan (TW)

(72) Inventors: Wei-Ta Chen, Tainan (TW); Keng-Chu Lin, Tainan (TW)

(73) Assignee: CHIMEI CORPORATION, Tainan (TW)

( * ) Notice: Subject to any disclaimer, the term of this patent is extended or adjusted under 35 U.S.C. 154(b) by 225 days.

(21) Appl. No.: 16/680,593

(22) Filed: Nov. 12, 2019

(65) Prior Publication Data

US 2020/0203561 A1 Jun. 25, 2020

(30) Foreign Application Priority Data

Dec. 21, 2018 (TW) .................................. 107146545

(51) Int. Cl.
| | |
|---|---|
| *H01L 33/06* | (2010.01) |
| *H01L 33/50* | (2010.01) |
| *H01L 33/56* | (2010.01) |
| *C09K 11/88* | (2006.01) |
| *H01L 27/15* | (2006.01) |
| *B82Y 20/00* | (2011.01) |

(Continued)

(52) U.S. Cl.
CPC ............ *H01L 33/06* (2013.01); *C09K 11/883* (2013.01); *H01L 27/156* (2013.01); *H01L 33/502* (2013.01); *H01L 33/56* (2013.01); *B82Y 20/00* (2013.01); *B82Y 30/00* (2013.01); *B82Y 40/00* (2013.01); *H01L 2933/0041* (2013.01)

(58) Field of Classification Search
CPC ....................................................... H01L 33/06
See application file for complete search history.

(56) References Cited

U.S. PATENT DOCUMENTS

2007/0132052 A1  6/2007  Sargent et al.
2011/0101387 A1  5/2011  Kinomoto
(Continued)

FOREIGN PATENT DOCUMENTS

| CN | 108102640 A | 6/2018 |
|---|---|---|
| TW | I636120 B | 9/2018 |

OTHER PUBLICATIONS

Non-Final Office Action issued in U.S. Appl. No. 16/680,616, filed Nov. 12, 2019, dated May 12, 2021.
(Continued)

*Primary Examiner* — Mounir S Amer
(74) *Attorney, Agent, or Firm* — McClure, Qualey & Rodack, LLP (57) ABSTRACT

The present disclosure provides a quantum dot and a manufacturing method for the same, and a luminescent material, a light-emitting element and a display device applying the quantum dot. The quantum dot includes a core and a shell layer. The core is at least one selected from the group consisting of a XII-XV group compound semiconductor nano-crystal, a XII-XVI group compound semiconductor nano-crystal, a XIII-XV group compound semiconductor nano-crystal and a XIII-XVI group compound semiconductor nano-crystal. The core contains a cadmium element and a selenium element. The shell layer contains a zinc element and a sulfur element. The shell layer encloses the core.

20 Claims, 4 Drawing Sheets

(51) Int. Cl.
 *B82Y 30/00* (2011.01)
 *B82Y 40/00* (2011.01)

(56) References Cited

U.S. PATENT DOCUMENTS

| | | | |
|---|---|---|---|
| 2014/0242631 A1* | 8/2014 | Yang | H01L 33/06 435/29 |
| 2018/0151817 A1 | 5/2018 | Cho et al. | |
| 2019/0044025 A1 | 2/2019 | Chen | |
| 2019/0276737 A1* | 9/2019 | Won | C09K 11/02 |
| 2019/0355883 A1* | 11/2019 | Yeh | H01L 33/56 |

OTHER PUBLICATIONS

TIPO Office Action dated Jul. 26, 2019 in corresponding Taiwan application (No. 107146545).
Taiwan Office Action dated Feb. 7, 2020, issued in application No. TW 10920110400.

* cited by examiner

QUANTUM DOT AND MANUFACTURING METHOD FOR THE SAME AND APPLICATION USING THE SAME

This application claims the benefit of Taiwan application Serial No. 107146545, filed Dec. 21, 2018, the subject matter of which is incorporated herein by reference.

BACKGROUND

Technical Field

The disclosure relates in general to a quantum dot and a manufacturing method for the same and an application using the same.

Description of the Related Art

A quantum dot is a semiconductor light-emitting material having a band gap that may be changed with its grain size. As a result, an emission wavelength of the quantum dot may be adjusted by changing a size of the quantum dot. The quantum dot has high color purity and high color saturation, and therefore has gradually been applied in the art of display panels in recent years. A quantum yield is one of the important characteristics of the quantum dot, and represents an efficiency of a conversion from absorbed light into fluorescent light done by the quantum dot. Therefore, a topic regarding methods of increasing the quantum yield of the quantum dot becomes important in the art.

SUMMARY

The present disclosure provides a quantum dot and a manufacturing method for the same, and a luminescent material, a light-emitting element and a display device applying the quantum dot.

According to a first concept of the present disclosure, a quantum dot is provided. The quantum dot comprises a core and a shell layer. The core is at least one selected from the group consisting of a XII-XV group compound semiconductor nano-crystal, a XII-XVI group compound semiconductor nano-crystal, a XIII-XV group compound semiconductor nano-crystal and a XIII-XVI group compound semiconductor nano-crystal. The core contains a cadmium element and a selenium element. The shell layer contains a zinc element and a sulfur element. The shell layer encloses the core. Based on a total content of the cadmium element, the selenium element, the zinc element and the sulfur element of the quantum dot, a content of the zinc element is in a range of 51 at %-64 at %, a content of the sulfur element is in a range of 32 at %-38 at %.

According to a second concept of the present disclosure, a quantum dot is provided. The quantum dot comprises a core and a shell layer. The core is at least one selected from the group consisting of a XII-XV group compound semiconductor nano-crystal, a XII-XVI group compound semiconductor nano-crystal, a XIII-XV group compound semiconductor nano-crystal and a XIII-XVI group compound semiconductor nano-crystal. The shell layer contains a zinc element and a sulfur element. The shell layer encloses the core. The core and the shell layer have a core-shell element. Based on a total content of the core-shell element, a content of a zinc element of the core-shell element is in a range of 51 at %-64 at %, a content of a sulfur element of the core-shell element is in a range of 32 at %-38 at %.

According to a third concept of the present disclosure, a method for manufacturing a quantum dot is provided. The method comprises the following steps. A core-shell solution is provided. The core-shell solution contains a core. The core is at least one selected from the group consisting of a XII-XV group compound semiconductor nano-crystal, a XII-XVI group compound semiconductor nano-crystal, a XIII-XV group compound semiconductor nano-crystal and a XIII-XVI group compound semiconductor nano-crystal. A zinc element raw material solution is provided. The zinc element raw material solution has zinc acetate and a rest substance. The zinc acetate has a weight of Q mg. The rest substance has a volume of R mL. Q/R=150-400. A sulfur element raw material solution is provided. The core-shell solution, the zinc element raw material solution, and the sulfur element raw material solution are mixed.

According to a fourth concept of the present disclosure, a luminescent material is provided. The luminescent material comprises the aforementioned quantum dot, or the quantum dot manufactured by the aforementioned method.

According to a fifth concept of the present disclosure, a light-emitting element is provided. The light-emitting element comprises a light source and an encapsulating material. The encapsulating material comprises the aforementioned luminescent material. The encapsulating material covers the light source.

According to a sixth concept of the present disclosure, a display device is provided. The display device comprises the aforementioned light-emitting element. The display device is at least one selected from the group consisting of a television, a digital photo camera, a digital video camera, a digital photo frame, a mobile phone, a notebook, a mobile computer, a computer screen, a portable game console, a portable information terminal, a portable audio player, a game console, a car display and a wearable device.

The above and other embodiments of the disclosure will become better understood with regard to the following detailed description of the non-limiting embodiment(s). The following description is made with reference to the accompanying drawings.

DETAILED DESCRIPTION

Embodiments of the present disclosure are disclosed in detail as the following accompanying with figures. It is should be noted that elements shown in the figure may be not drawn according to actual scales, and may be drawn with enlarged or reduced sizes optionally for sake of showing features of the present disclosure clearly. The same or similar elements in the specification and the figures may be labeled with the same or similar symbols.

Various features of the present disclosure are disclosed with the following various embodiments or examples, describing the elements and arrangements thereof. It is of course that the embodiments and examples are used for illustrating the present disclosure, and the present disclosure is not limited thereto. In addition, although different embodiments may be illustrated with the same symbols or marks, the repetition symbols or marks are just for sake of simple and clear disclosing the present disclosure, but not indicating specific relations between the illustrated different embodiments and/or structures.

Moreover, it should be understood that there may be additional steps before, during, or after the steps disclosed in the present disclosure. In addition, some steps in an embodiment may be replaced or omitted in another embodiment.

Figure 1:
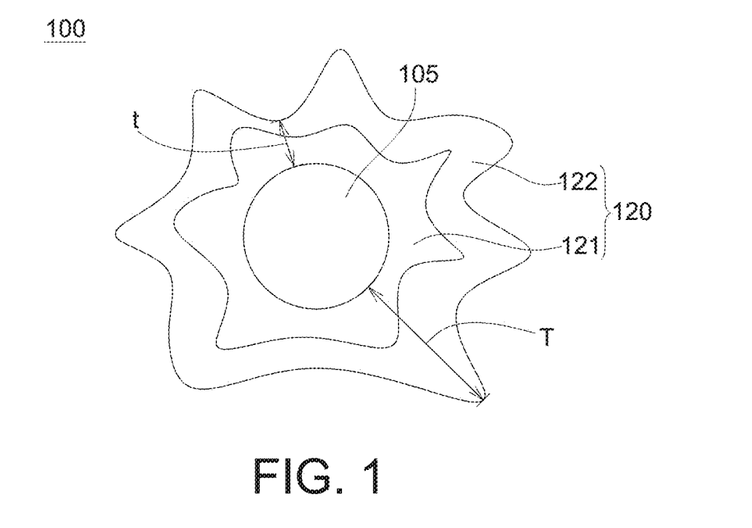
FIG. 1 is a structural diagrammatic drawing of a quantum dot according to an embodiment of the present disclosure.

FIG. 1 is a structural diagrammatic drawing of a quantum dot 100 according to an embodiment of the present disclosure.

Referring to FIG. 1, in the present embodiment, the quantum dot 100 comprises a core 105 and a shell layer 120. The shell layer 120 encloses the core 105. The quantum dot 100 may have a particle size larger than or equal to 10 nm. For example, the particle size may be in a range of 17 nm-25 nm.

In an embodiment, the core 105 may be a nano-crystal, and may be at least one selected from the group consisting of a XII-XV group compound semiconductor nano-crystal, a XII-XVI group compound semiconductor nano-crystal, a XIII-XV group compound semiconductor nano-crystal and a XIII-XVI group compound semiconductor nano-crystal.

The core 105 may have a spherical shape substantially. The core 115 may comprise at least a cation and at least an anion. The cation may comprise a XII group element and/or a XIII group element in the periodic table. For example, the cation of the core 115 may comprise cadmium (Cd), zinc (Zn), mercury (Hg), aluminum (Al), gallium (Ga) and/or indium (In). The anion of the core 115 may comprise a XV group element and/or a XVI group element. For example, the anion may comprise sulfur (S), selenium (Se), tellurium (Te), nitrogen (N), phosphorus (P) and/or arsenic (As). In some embodiments, the core may be a binary core (for example, comprising CdSe, CdTe, CdS, ZnS, ZnSe, ZnTe, HgS, HgSe, HgTe, GaN, GaP, GaAs, AlN, AlP, AlAs, InN, InP, InAs and so on), a ternary core (for example, comprising CdZnS, ZnSeTe, CdSeS, CdZnSe, CdZnTe, CdSeTe, CdSTe, ZnSeS, ZnSTe, HgSeS, HgSeTe, HgSTe, CdHgS, CdHgSe, CdHgTe, HgZnS, HgZnSe, HgZnTe, GaNP, GaNAs, GaPAs, AlNP, AlNAs, AlPAs, InNP, InNAs, InPAs, etc.), or a quaternary core (for example, comprising CdZnSeS, CdZnSeTe, CdZnSTe, CdHgSeS, CdHgSeTe, CdHgSTe, HgZnSeS, HgZnSeTe, HgZnSTe, GaAlNP, GaAlNAs, GaAlPAs, GaInNP, GaInNAs, GaInPAs, InAlNP, InAlNAs, InAlPAs, etc.).

In an embodiment, the core 105 contains at least a cadmium element and a selenium element. Based on a total content of a core-shell element of the core 105 and the shell layer 120 of the quantum dot 100 (i.e. a total content of a core element of the core 105 and a shell element of the shell layer 120), a content of the cadmium element is in a range of 0.5 at %-5 at %, for example 0.7 at %-4 at %, or 1 at %-3 at %; a content of the selenium element is in a range of 3 at %-16 at %, for example 4 at %-13 at %, or 5 at %-11 t %.

In an embodiment, a content ratio (Cd/Se) of the cadmium element to the selenium element is in a range of 0.03-1.7, for example 0.05-1.4, or 0.07-1.

Referring to FIG. 1, the shell layer 120 may comprise a first shell layer 121 and a second shell layer 122. The first shell layer 121 encloses the core 105, and the second shell layer 122 encloses the first shell layer 121. According to the concept of the present disclosure, the shell layer is not limited to the structure of two-layer shell layer as shown in FIG. 1. In another embodiment, the shell layer 120 may have only single shell layer structure. For example, the shell layer 120 may have only the first shell layer. In other embodiments, the shell layer 120 may have a shell layer structure of more layers, such as three layers (for example with further comprising a third shell layer enclosing the second shell layer), four layers (for example with further comprising a fourth shell layer enclosing the third shell layer), five layers (for example with further comprising a fifth shell layer enclosing the fourth shell layer), six layers (for example with further comprising a sixth shell layer enclosing the fifth shell layer), etc. In addition, compositions and/or properties of the shell layers may be identical with or different from each other.

In an embodiment, the shell layer 120 may contains at least a cation and at least an anion. The cation of the shell layer 120 may comprise a XII group element. In embodiments, the cation of the shell layer 120 contains at least a zinc (Zn) element, and may further comprise other kinds of the XII group element depending on circumstances. The anion of the shell layer 120 may comprise a XVI group element. In embodiments, the anion of the shell layer 120 comprises at least a sulfur (S) element, and may further comprise other kinds of the XVI group element depending on circumstances. In some embodiments, at least one shell layer of the shell layer 120 may be a binary shell layer (for example comprising ZnS), or a ternary shell layer containing at least the zinc element and the sulfur element (for example comprising ZnCdS), or a shell layer of more kinds of elements.

In some embodiments, the shell layer 120 (such as the first shell layer 121 and/or the second shell layer 122, and/or other outer shell layers) may have a composition having a gradient distribution. Different portions of shell layer 120 may have different cation contents and/or anion contents. In other words, the cation content and/or the anion content may vary from an innermost portion of the shell layer 120 to an outermost portion of the shell layer 120. For example, when the shell layer 120 contains zinc (Zn), and sulfur (S), a zinc concentration of the shell layer 120 (such as the first shell layer 121 and/or the second shell layer 122, and/or other outer shell layers) may be the lowest at the innermost portion of the shell layer 120 substantially, and may be the highest at the outermost portion of the shell layer 120 substantially. In other words, the zinc concentration may increase substantially in proportion to an increase of a distance from the core 105. That is, the shell layer 120 has a zinc concentration increasing substantially in proportion to a distance from the core 105.

In some embodiments, the shell layer 120 (such as the first shell layer 121 and/or the second shell layer 122, and/or other outer shell layers) may have a uniform (or identical) composition substantially. For example, every portion of the shell layer 120 (such as the first shell layer 121 and/or the second shell layer 122, and/or other outer shell layers) may have a substantial uniform (or identical) cation content, and/or a substantial uniform (or identical) anion content.

In an embodiment, the shell layer 120 contains at least the zinc element and the sulfur element. In addition, based on the total content of the core-shell element of the core 105 and the shell layer 120 of the quantum dot 100 (i.e. the total content of the core element of the core 105 and the shell element of the shell layer 120), a content of the zinc element is in a range of 51 at %-64 at %, such as 52 at %-63 at %, or 52.5 at %-62 at %; a content of the sulfur element is in a range of 32 at %-38 at %, such as 32.5 at %-38 at %, or 33 at %-37 at %. In an embodiment, a content ratio (Zn/S) of the zinc element to the sulfur element is in a range of 1.34-2, such as 1.36-1.95, or 1.37-1.9.

Figure 6A:
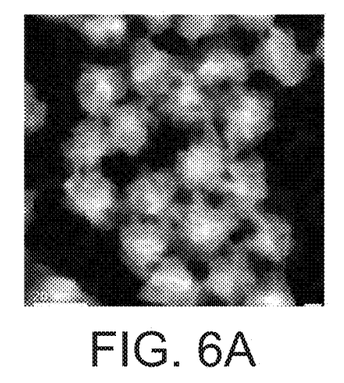
FIG. 6A is the S/TEM image of 900KX magnification of the embodiment 1 of the present disclosure.
Figure 6B:
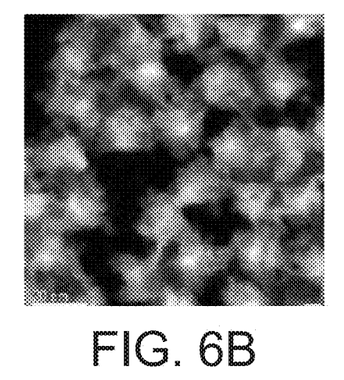
FIG. 6B is the S/TEM image of 900KX magnification of the embodiment 2 of the present disclosure.

In embodiments, the shell layer 120 has an irregular concave-convex outer surface. For example, the shell layer 120 may be a secondary particle 121Q formed by conjoining primary particles 121q, exhibiting an irregularly-varied thickness. In an embodiment, a thickness range of the shell layer 120 may be 2 nm-8 nm. In embodiments, from the pictures of the TEM analyses (for example, as shown in FIG. 6A and FIG. 6B), it could be found that a surface of the shell layer 120 has the secondary particle 121Q formed by aggregating the primary particles 121q, and therefore the quantum dot has an exterior exhibiting a stereo irregular polygon having different lengths on each side of which, such as an appearance of lava rock construction or flocculent structure.

The core 105 and/or the shell layer 120 of the quantum dot 100 may also comprise a ligand. The ligand may be disposed on a surface of the core 105 and/or the shell layer 120.

The ligand may comprise an organic functional group. The ligand may be provided onto the surface of the core 105 and/or the shell layer 120 so as to generate a chemical bond between the ligand and the surface of the core 105 and/or the shell layer 120. In embodiments, the ligand comprises a phosphine, a phosphine oxide, an alkyl phosphonic acid, an alkyl amine, an arylamine, a pyridine, a fatty acid compound (such as a long chain fatty acid compound), a thiophene, a thiol compound, a carbene compound, or a combination thereof. The fatty acid compound may comprise oleate, stearic acid, lauric acid, or a combination thereof. The phosphine compound may comprise trioctylphosphine (TOP), tributylphosphine, triphenylphosphine, tri-t-butylphosphine, or a combination thereof. The thiol compound may comprise octanethiol, 1,8-octanedithiol, 1-dodecanethiol, 1-undecanethiol, 1,4-benzene dimethanethiol, 1,16-hexadecanedithiol, 1,11-undecanedithiol, 4,4'-biphenyldithiol, 11-mercapto-1-undecanol, or a combination thereof. The alkyl amine may for example comprise oleylamine, octylamine, dioctylamine, 1-hexadecylamine, etc. For example, the carbene compound may comprise octadecene (ODE), etc.

In some embodiments, the organic group of the ligand can be referred to as a sealing agent, and can inhibit gathering of a plurality of the quantum dots 100, and can suitably isolate the quantum dot 100 from an external environment. In other embodiments, a surface of the quantum dot 100 may also be modified by adding an additional sealing agent to form the ligand on the surface of the shell layer 120. The sealing agent may be composed of a Lewis base compound. In some embodiments, the aforementioned Lewis base compound may be formed by diluting a hydrocarbon compound in an inert solvent. The sealing agent may comprise a single-dentate ligand or a multidentate ligand, such as a phosphine, a phosphine oxide, an alkyl phosphonic acid, an alkyl amine, an arylamine, a pyridine, a long chain fatty acid compound, a thiophene, or a combination thereof. The phosphine oxide may comprise trioctylphosphine oxide and triphenylphosphine oxide, etc. The alkyl amine may comprise 1-hexadecylamine and octylamine, etc.

Figure 2:
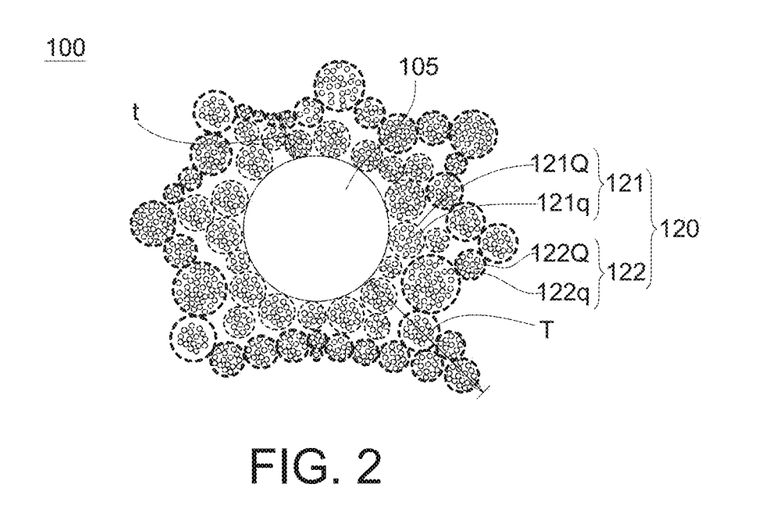
FIG. 2 is a structural diagrammatic drawing of a quantum dot according to another embodiment of the present disclosure.

FIG. 2 is a structural diagrammatic drawing of the quantum dot 100 according to another embodiment of the present disclosure, which is different from the quantum dot 100 shown in FIG. 1 with the following description. In embodiments as shown in FIG. 2, the shell layer 120 comprises a secondary particle formed by conjoining primary particles. In an embodiment, the first shell layer 121 comprises the secondary particle 121Q formed by conjoining the primary particles 121q. The second shell layer 122 comprises a secondary particle 122Q formed by conjoining primary particles 122q. In another embodiment, the secondary particle may be comprised by only one of the first shell layer 121 and the second shell layer 122. In other embodiments, as the quantum dot 100 further comprises an additional shell layer of outer layer, the secondary particle may be comprised by at least one of the shell layers (for example the first shell layer 121, the second shell layer 122, the third shell layer (not shown), the fourth shell layer (not shown), the fifth shell layer (not shown), the sixth shell layer (not shown), etc.).

In embodiments, the quantum dot 100 shown in FIG. 1 or FIG. 2 may exhibit various colors according to a composition of which. Therefore, the quantum dot 100 can emit an emission light of various colors, such as blue, red, green, and so on. In some embodiments, the quantum dot 100 may be a blue quantum dot or a green quantum dot.

Specifically, the quantum dot 100 may emit an emission light having a wavelength of 400 nm to 700 nm after receiving an incident light having a wavelength equal to or greater than 350 nm and less than the wavelength of the emission light, such as an incident light having a wavelength of 390 nm to 500 nm. In addition, a spectrum peak of the emission light emitted from the quantum dot 100 has a full width at half maximum (FWHM) of 18 nm to 60 nm, for example. In some embodiments, an emission light emitted from the green 13T quantum dot has a wavelength of 500 nm to 600 nm, or 510 nm to 560 nm, or 520 nm to 550 nm, for example. In other embodiments, an emission light emitted from a red quantum dot has a wavelength of 600 nm to 700 nm, or 605 nm to 680 nm, or 610 nm to 660 nm, for example. An emission light emitted from the blue quantum dot has a wavelength of 400 nm to 500 nm, or 430 nm to 470 nm, or 440 nm to 460 nm, for example. For example, a wavelength, an intensity, and a full width at half maximum (FWHM) of an emission light emitted from the quantum dot can be obtained through photoluminescence analysis with using a photoluminescence analyzer (made by Horiba, model: FluoroMax-3).

In some embodiments, the red quantum dot has an average particle size of 3 nm to 25 nm, or 4 nm to 15 nm, or 5 nm to 10 nm, for example. The green quantum dot has an average particle size of 2 nm to 25 nm, or 3 nm to 23 nm, or 4 nm to 22 nm, for example. The blue quantum dot has an average particle size of 1 nm to 15 nm, or 2 nm to 10 nm, or 2 nm to 8 nm, for example.

Figure 3:
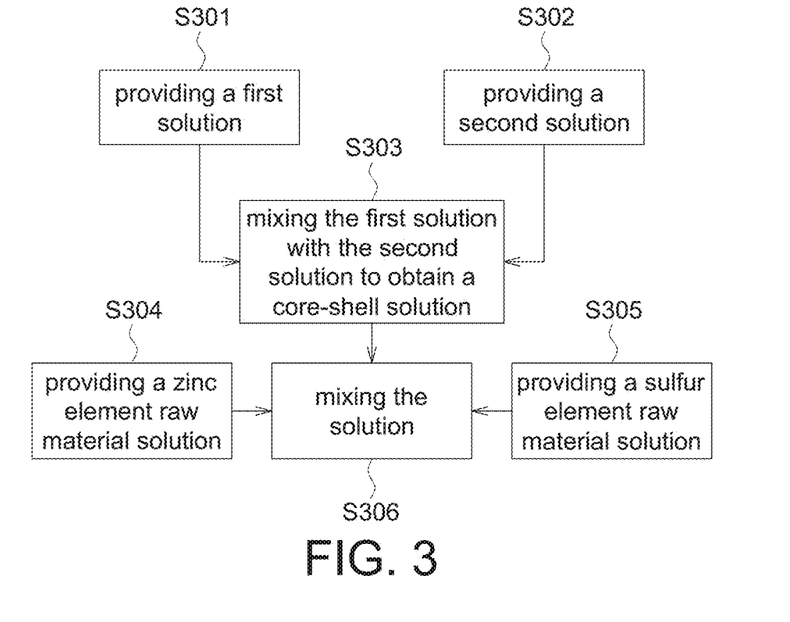
FIG. 3 is a flow diagram of a method for manufacturing a quantum dot according to an embodiment of the present disclosure.

FIG. 3 is a flow diagram of a method for manufacturing the quantum dot 100 according to an embodiment of the present disclosure.

A step S301 is performed, providing a first solution. The first solution contains at least one element selected from the group consisting of a XII group element and a XIII group element. Specifically, the XII group element or the XIII group element exists in a form of a cation in the first solution. For example, the XII group element of the first solution may comprise zinc, cadmium, mercury, or a combination thereof. The XIII group element of the first solution may comprise aluminum, gallium, indium, or a combination thereof. In some embodiments, the first solution may be formed by mixing the XII group element (or a precursor, such as an oxide and/or acetate of which) or the XIII group element (or a precursor, such as an oxide and/or acetate of which) with the ligand such as the fatty acid compound. In some embodiments, the first solution may have a first temperature. The first temperature may be 230° C. to 330° C., such as 240° C. to 320° C., such as 250° C. to 320° C.

A step S302 is performed, providing a second solution. The second solution contains at least one element selected from the group consisting of a XV group element and a XVI group element. Specifically, the XV group element or the XVI group element exists in a form of an anion in the second solution. For example, the XV group element of the second solution may comprise at least one of nitrogen, phosphorus and arsenic. The XVI group element of the second solution may comprise at least one of oxygen, sulfur, selenium and tellurium. In some embodiments, the second solution may be formed by mixing the XV group element (or a precursor of which) or the XVI group element (or a precursor of which) with the ligand such as the phosphine compound, the carbene compound, and/or the alkyl amine. In some embodiments, the second solution may have a second temperature being the room temperature, such as 20° C. to 30° C., or 25° C. to 30° C., provided for mixing the raw materials in the second solution.

A step S303 is performed, mixing the first solution with the second solution to obtain a core-shell solution. By which, the core-shell solution containing the core, and the shell layer enclosing the core of the quantum dot may be formed. In detail, during the step S303, a reaction between the cation of the first solution and the anion of the second solution occurs so as to form the core 105 and the shell layer 121. The shell layer 121 encloses an outside of the core 105.

In some embodiments, a thermal treatment may be performed to the core-shell solution. As a result, the temperature of the core-shell solution can be increased, so as to return to the higher one of the temperature of the first solution and the temperature of the second solution. In some embodiments, the temperature of the core-shell solution after the thermal treatment may be higher than the temperature of the first solution and the temperature of the second solution. A range of a heating rate of the thermal treatment is 2° C./minute to 10° C./minute. In some embodiments, the range of the heating rate of the thermal treatment may be 3° C./minute to 8° C./minute. In other embodiments, the range of the heating rate of the thermal treatment is 3.5° C./minute to 7.5° C./minute. Moreover, an operation time of the thermal treatment can be within a range of 1 minute to 15 minutes, or within a range of 1.5 minutes to 10 minutes. The step of the thermal treatment may be before an end point of the step S303. In other words, the thermal treatment may be performed to the core-shell solution while mixing the first solution and the second solution. In other embodiments, a starting point of the step of the thermal treatment may also be later than the end point of the step S303. In other words, the thermal treatment may be performed to the core-shell solution after the mixing of the first solution and the second solution is complete.

A step S304 is performed, providing a zinc element raw material solution. The zinc element raw material solution is used for providing the zinc element for forming the shell layer. The zinc element raw material solution contains at least the zinc element, but can also contain the additional XII group element and/or XIII group element of another kind. In an embodiment, the zinc element raw material solution has zinc acetate having a weight of Q mg. A rest substance of the zinc element raw material solution has a volume of R mL. $Q/R=150-400$. In an embodiment, the rest substance of the zinc element raw material solution may comprise a ligand source such as oleate, octadecene, etc., and/or comprise a solvent, etc.

A step S305 is performed, providing a sulfur element raw material solution. The sulfur element raw material solution is used for providing the sulfur element for forming the shell layer. The sulfur element raw material solution contains at least the sulfur element, but can also contain the additional XV group element and/or XVI group element of another kind.

A step S306 is performed, mixing the solutions, i.e. mixing the core-shell solution, the zinc element raw material solution, and the sulfur element raw material solution. In detail, the zinc element raw material solution and the sulfur element raw material solution are added into the core-shell solution formed by mixing the first solution and the second solution in the step S303. In some embodiments, the XII group element of the zinc element raw material solution exists in a form of a cation in the zinc element raw material solution, and the XVI group element of the sulfur element raw material solution exists in a form of an anion in the sulfur element raw material solution, and a reaction of which forms the shell layer 122 of the quantum dot 100. As a result, the quantum dot 100 comprises the shell layer 122, the shell layer 121 and the core 105 from outside to inside. The core 105 and the shell layer 120 may respectively be single-layer structures, and can respectively be multilayer structures as well.

In the step S306, a sequence for mixing the zinc element raw material solution and the sulfur element raw material solution is not limited. In an embodiment, the zinc element raw material solution and the sulfur element raw material solution may be simultaneously mixed in the core-shell solution formed by mixing the first solution and the second solution in the step S303. In another embodiment, the zinc element raw material solution and the sulfur element raw material solution may be alternately mixed. For example, the zinc element raw material solution is firstly mixed, and then the sulfur element raw material solution is mixed. Otherwise, the sulfur element raw material solution is firstly mixed, and then the zinc element raw material solution is mixed. Otherwise, one the zinc element raw material solution and one the sulfur element raw material solution are firstly mixed to form one the shell layer of inner layer, then another the zinc element raw material solution and another the sulfur element raw material solution are mixed to form another the shell layer of outer layer, or then yet another the zinc element raw material solution and yet another the sulfur element raw material solution are mixed to form yet another the shell layer of more outer layer, and so on in a similar fashion. Properties of the different shell layers may be decided according to process parameters, and may be identical with or different from each other.

The zinc element raw material solution and/or the sulfur element raw material solution may contain the ligand. As such, the ligand may be formed on the core and/or the shell layer through the step S306. Otherwise, a further mixing of the ligand or a solution containing the ligand may be performed in the step S306.

In some embodiments, the step S306 may be performed at a second temperature. In some embodiments, a range of the second temperature may be 230° C. to 330° C. In other embodiments, the range of the second temperature may be 240° C. to 320° C., such as 250° C. to 320° C. In some embodiments, the second temperature may be higher than the first temperature. During the forming process of the shell layer 120, by performing a heating process, the semiconductor material composing the shell layer 120 can be successfully formed on the surface of the core 105, rather than being dispersed in the solution. As a result, the shell layer 120 of the quantum dot 100 can preferably protect the core 105 to prevent the core 105 from damage of external moisture, oxygen, and blue light. Therefore, a reliability of the quantum dot 100 can be improved.

Next, the mixed solution obtained in the step S306 is precipitated, centrifugally separated and washed with a polar solvent such as acetone, ethanol, and so on, so as to obtain the quantum dot 100 of the present embodiment.

In embodiments, the quantum dot 100 can be applied for a luminescent material.

In some embodiments, a method for manufacturing the luminescent material with using the above described quantum dot 100 may comprise the following steps.

First, a quantum dot solution and a carrier solution are provided. The quantum dot solution contains a plurality of the aforementioned quantum dots 100 and a solvent for dispersing the quantum dots. Similarly, the carrier solution contains a plurality of carriers and a solvent for dispersing the carriers. For example, the solvent of the quantum dot solution and the solvent of the carrier solution can individually include n-hexane. In some embodiments, a weight percentage of the quantum dots 100 in the quantum dot solution is 0.1% to 5%. A weight percentage of the carriers in the carrier solution is 0.5% to 10%.

In some embodiments, a material of the carrier can be at least one selected from the group consisting of an organic polymer, an inorganic polymer, a water-soluble polymer, an organic solvent-soluble polymer, a biopolymer, and a synthetic polymer. For example, the material of the carrier may be at least one selected from the group consisting of polysiloxane, polyacrylate, polycarbonate, polystyrene, polyethylene, polypropylene, polyketide, polyetheretherketone, polyester, polyamide, polyimide, polyacrylamide, polyolefin, polyacetylene, polyisoprene, polybutadiene, polyvinylidene difluoride (PVDF), polyvinyl chloride (PVC), ethylene vinyl acetate (EVA), polyethylene terephthalate (PET), polyurethane, and cellulose polymer. In some embodiments, the material of the carrier can also be an inorganic medium such as at least one selected from the group consisting of silica gel, bentonite, glass, water glass, quartz, kaoline, silicon dioxide, aluminum oxide, and zinc oxide.

An average particle size of the carrier is 0.1 μm to 18 μm, or 0.3 μm to 15 μm, or 0.5 μm to 10 μm, for example. In some embodiments, the material of the carrier is porous. An average surface pore size of the porous carrier is 3 nm to 100 nm. In some embodiments, the quantum dot 100 is the green quantum dot, and the average surface pore size of the porous carrier is 7 nm to 30 nm, or 10 nm to 28 nm, or 10 nm to 25 nm, for example. In other embodiments, the quantum dot 100 is the red quantum dot, and the average surface pore size of the porous carrier is 7 nm to 40 nm, or 7 nm to 35 nm, or 7 nm to 30 nm, for example. Moreover, when the quantum dot 100 is the blue quantum dot, the average surface pore size of the porous carrier is 3 nm to 25 nm, or 5 nm to 22 nm, or 7 nm to 22 nm, for example. A specific surface area of the porous carrier is 100 m²/g to 1000 m²/g, for example. In some embodiments, the porous carrier is a porous micron-particle. The porous micron-particle may be a silicon dioxide particle. The carrier may be a lipophilic carrier. For example, the porous micron-particle can be a lipophilic silicon dioxide particle. The lipophilic silicon dioxide particle is obtained by modifying a silicon dioxide particle with a silane compound shown in formula (II) below:

$$R^c_m Si(OR^d)_{4-m} \quad m=1\text{-}3 \qquad \text{formula (II);}$$

$R^c$ represents a $C_3$ to $C_{20}$ alkyl group, and $R^d$ represents a $C_1$ to $C_5$ alkyl group. In some embodiments, $R^c$ is an octyl group, a nonyl group, or a decyl group. $R^d$ is (but not limited to) a methyl group, an ethyl group, an n-propyl group, an isopropyl group, or an n-butyl group, for example.

For example, the porous carrier consisting of silicon dioxide may have an average particle diameter of 1 μm to 5 μm, an average surface pore size of 5 nm to 30 nm, and a specific surface area of 500 m²/g to 900 m²/g; or an average particle size of 1 μm to 5 μm, an average surface pore size of 10 nm to 30 nm, and a specific surface area of 250 m²/g to 750 m²/g.

In an embodiment, the carrier uses fumed silica, which may be an aggregate of a plurality of primary particles really combined together and incapable of being separated from each other. In other words, the carrier may have an irregular shape. Said irregular shape refers to a carrier shape with a non-periodical contour on a two-dimensional plane, which means that the contour is not constituted by any repeating geometric shapes generally known in the art in which each geometric shape can be easily recognized. For said irregular shape, a contour on a two-dimensional plane which is not constituted by one or more selected from the group consisting of a circle shape, an ellipse shape, a rectangle shape, a square shape, a diamond shape, a triangle shape, a trapezoid shape, and the like is preferred.

In another embodiment, the fumed silica by be modified with the silane compound having the formula (II) as described above so as to have lipophilic property.

Next, the quantum dot solution and the carrier solution are mixed. In this step, the quantum dot 100 in the quantum dot solution can be attached onto the carrier in the carrier solution. In some embodiments, the carrier has a large specific surface area and a strong surface adsorbing force, which benefits uniform and stable attaching of the quantum dots 100 on the carrier. Next, the solution containing the quantum dot 100 and the carrier may be left to stand, and then a centrifugation and a filtration are performed to obtain the carrier to which the quantum dot 100 is attached.

Next, the solution containing the quantum dot 100 and the carrier is mixed with and a solution containing an encapsulating material. In this step, the encapsulating material can enclose a surface of the carrier to which the quantum dot is attached to form an encapsulating layer. In some embodiments, a thickness of the encapsulating layer may be 0.1 nm to 20 nm.

The encapsulating material may be at least one selected from the group consisting of an organic polymer, an inorganic polymer, a water-soluble polymer, an organic solvent-soluble polymer, a biopolymer, and a synthetic polymer. For example, the encapsulating material may be at least one selected from the group consisting of polysiloxane, polyacrylate, polycarbonate, polystyrene, polyethylene, polypropylene, polyketide, polyetheretherketone, polyester, polyamide, polyimide, polyacrylamide, polyolefin, polyacetylene, polyisoprene, polybutadiene, polyvinylidene difluoride (PVDF), polyvinyl chloride (PVC), ethylene vinyl acetate (EVA), polyethylene terephthalate (PET), polyurethane, and cellulose polymer. In some embodiments, the encapsulating material may also be an inorganic medium such as at least one selected from the group consisting of silica gel, bentonite, glass, water glass, quartz, kaoline, silicon dioxide, aluminum oxide, and zinc oxide. In some embodiments, the encapsulating layer and the carrier may be formed by the same material. In other embodiments, the encapsulating layer and the carrier may also be formed by different materials.

Next, a centrifugal separation may be performed to the solution containing the carrier, the quantum dot 100, and the encapsulating layer to obtain a luminescent material. In other words, the luminescent material may comprise the carrier, the quantum dot 100, and the encapsulating layer. The quantum dot 100 is attached on the surface of the carrier, and the encapsulating layer encloses the quantum dot 100 and the carrier.

In some embodiments, a weight percentage of the quantum dot 100 occupying in the luminescent material may be 0.1% to 20%. In other embodiments, the weight percentage of the quantum dot 100 occupying in the luminescent material may also be 0.2% to 15%, or 0.3% to 10%. When the weight percentage of the quantum dot 100 occupying in the luminescent material is less than 0.1%, a concentration of the quantum dot 100 in the luminescent material is low, and therefore an overall luminous efficiency of the luminescent material is poor. When the weight percentage of the quantum dot 100 occupying in the luminescent material is higher than 20%, a self-absorption readily occurs to the quantum dot 100, and therefore the overall luminous efficiency of the luminescent material is reduced, and a red shift occurs to the emission light. For example, the weight percentage can be measured by an inductively-coupled plasma (ICP) spectral analysis method.

In some embodiments, the luminescent material can be applied in the encapsulating material for a light-emitting device. For example, the encapsulating material of the light-emitting device may include an epoxy resin, polysiloxane resin, acrylate resin, or glass, and so on. In the light-emitting device, the encapsulating material encloses a light source (such as a LED, a laser source, an arc lamp, and a blackbody light source) such that a primary light generated by the light source may excite the quantum dot 100 in the encapsulating material to generate a secondary light. A wave band of the primary light may be different from a wave band of the secondary light. In other words, a color of the primary light may be different from a color of the secondary light. Moreover, predetermined intensity and wavelength of the entire light emitted by the light-emitting device may be satisfied by a suitable mixture of the primary light and the secondary light according to the colors thereof. It should be noted that the light emitted by the light-emitting device may be only the light emitted by the quantum dot 100 (i.e., the secondary light), or a mixture of the light emitted by the light source and the light emitted by the quantum dot 100 (i.e., a mixture of the primary light and the secondary light). In some embodiments, the luminescent material may include a single type of the quantum dot 100, or a plurality of types of the quantum dot 100 having different colors.

In the present embodiment, the luminescent material can be applied in the encapsulating material for a light emitting diode (LED). The encapsulating material for use may be (but not limited to) an epoxy resin, a polysiloxane resin, an acrylate resin, a glass, for example. The light emitting diode (LED) may be used as a backlight unit or a light-emitting element for other light emitting devices. Otherwise, the light emitting diode (LED) may be applied in a quantum dot light emitting diode (QLED) display device having a plurality of the light emitting diodes arranged in an array, and each LED in the QLED display equipment is a single pixel.

Figure 4:
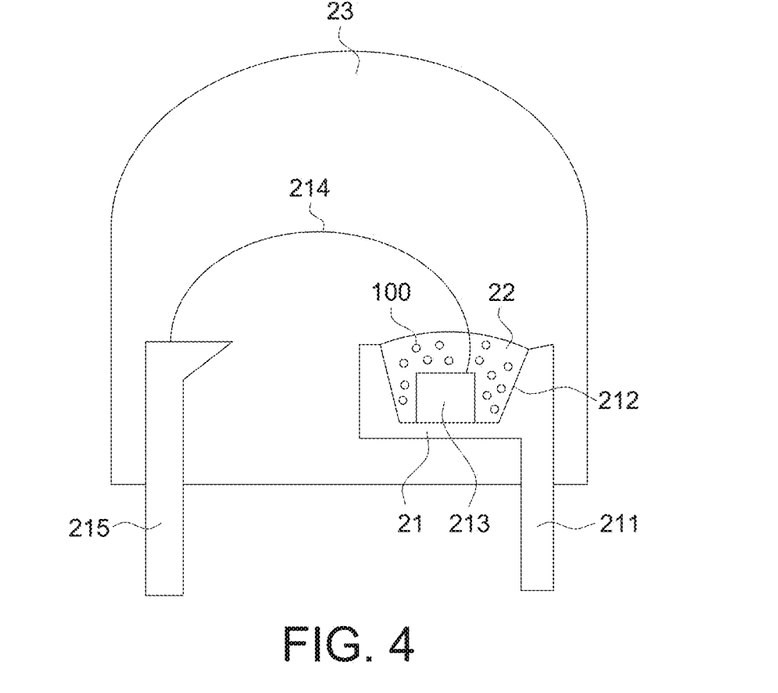
FIG. 4 illustrates a cross-sectional diagram of a light emitting device in an embodiment.

FIG. 4 illustrates a cross-sectional diagram of a light emitting device in an embodiment. The light emitting device comprises a light emitting unit 21, a phosphor layer 22, and an encapsulating layer 23. The light emitting unit 21 comprises a base 211 having a conductive characteristic and having a concave bearing surface 212, a light-emitting element 213 disposed in the concave bearing surface 212 and electrically connected to the base 211, a connection wire 214 electrically connected to the light-emitting element 213, and a conductive wire 215 electrically connected to the connection wire 214. The base 211 and the conductive wire 215 can cooperate to supply an external electrical energy to the light-emitting element 213. The light-emitting element 213 can convert the electrical energy to light energy and emit it out. In an embodiment, the light-emitting element 213 uses a commercial available InGaN light-emitting element (EPISTAR Corporation) of light emitting wavelength of 455 nm, and is adhered on the concave bearing surface 212 of the base 211 with a conductive silver paste (BQ6886, Uninwell International). The light-emitting element 213 is electrically connected to the conductive wire 215 through the connection wire 214 extended from the top surface of the light-emitting element 213. The phosphor layer 22 encloses the light-emitting element 213. After the luminescent material 100 contained in the phosphor layer 22 is excited by a light emitted from the light-emitting element 213, the luminescent material 100 converts the light emitted from the light-emitting element 213 to emit a light having a wavelength different from the wavelength of the exciting light. In the present embodiment, the phosphor layer 22 is formed by coating a polysiloxane resin with the luminescent material 100 contained therein on an external surface of the light-emitting element 213 followed by a drying and a curing.

In the present disclosure, the luminescent material may use the quantum dots 100 and the phosphors of various colors and materials. When more kinds of the quantum dots 100 and the phosphors with different compositions (i.e. more different emission wavelengths) are used, the light emitting device can achieve a wider emission spectrum, even achieve a full spectrum for demands. Therefore, using the luminescent material according to the present disclosure for the display device can improve a color gamut, a color purity, a color trueness, NTSC, etc., effectively. In embodiments, the NTSC of the display device may be adjusted by the phosphors disposed on a LED chip in a LED element to achieve NTSC 100% and reduce the manufacturing cost.

Figure 5:
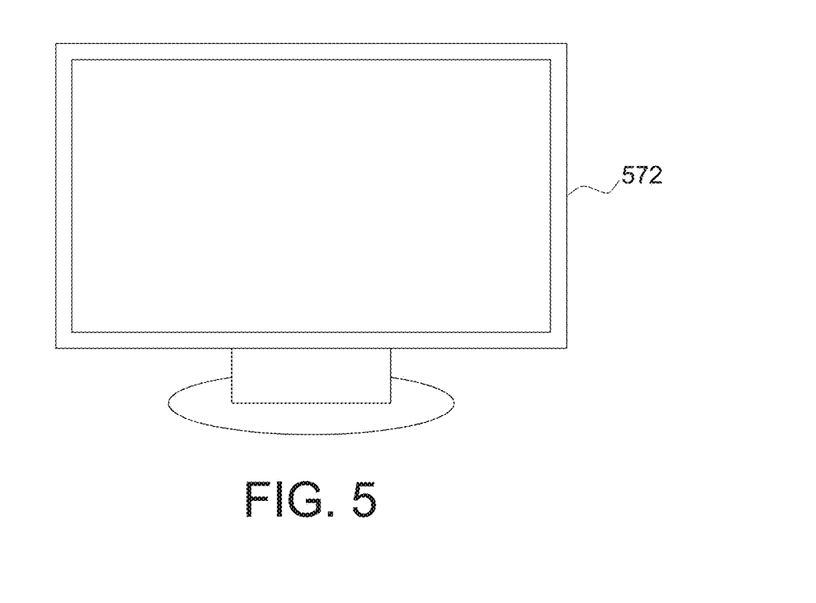
FIG. 5 is a diagrammatic drawing of a display device according to a concept of an embodiment.

In the present disclosure, the light-emitting element may be applied in various display devices, for example, a television 572 (which may be referred to as a television receiver) (as shown in FIG. 5), a digital photo camera, a digital video camera, a digital photo frame, a mobile phone, a notebook, a mobile computer, a computer screen, a portable game console, a portable information terminal, a portable audio player, a game console, a car display and a wearable device (such as a smart watch or virtual reality glasses), and so on.

It should be understood that the luminescent material of the present disclosure is not limited to the encapsulating material for the LED, and may be applied for an optical film, an optical plate, a transparent tube member, an optical part, a back light unit, a light emitting device, a color converting material, an optical material, an oil ink, a labeling agent, etc.

Embodiments and a comparative example are provided below to verify the effect of the invention, but the invention is not limited to the following content.

Embodiment 1

First, the first solution was provided. 36 mg of cadmium oxide, 615 mg of zinc acetate, and 14 mL of oleic acid were added into a three-necked flask. Next, 30 mL of octadecene was added into the three-necked flask to form the first solution. The first solution was heated in vacuum at 120° C. Next, the three-necked flask was filled with nitrogen gas, and the temperature of the first solution was increased to 310° C.

The second solution was provided and mixed with the heated first solution to get the core-shell solution. Then, a thermal treatment was performed to the core-shell solution. In detail, the second solution containing 4.2 mL, 0.003 mol of trioctyl selenide (TOP-Se) and 135 mg of sulfur was provided and injected into the aforementioned three-necked flask to form the core-shell solution, and the core-shell solution reacted at the constant temperature of 310° C.

Next, the zinc element raw material solution and the sulfur element raw material solution were individually and alternately added into the core-shell solution from the outside of the core-shell solution so as to form a thick shell layer enclosing over the quantum dot in the core-shell solution. In detail, a third solution and a fourth solution were provided and mixed into the core-shell solution to form the mixed solution, and the thermal treatment was performed to the mixed solution. The third solution was the zinc element raw material solution, containing 976 mg of zinc acetate, 3.5 mL of oleic acid and 2.2 mL of octadecene. The third solution had the ratio (Q/R) of the weight of zinc acetate to the volume of the rest substance as 976/(3.5+2.2)=171.2. The fourth solution was the sulfur element raw material solution, containing 2.4 mL, 0.004 mol trioctylphosphine sulfide (TOP-S). The third solution and the fourth solution were injected into the aforementioned three-necked flask in sequence, and reacted at the constant temperature of 310° C.

A fifth solution, a sixth solution and a seventh solution were provided, and were added in sequence into the aforementioned mixed solution. The fifth solution was the zinc element raw material solution, containing 6300 mg of zinc acetate, 12.8 mL of oleic acid and 8 mL of octadecene. The fifth solution had the ratio (Q/R) of the weight of zinc acetate to the volume of the rest substance as 6300/(12.8+8)=302.9. The sixth solution was the sulfur element raw material solution, containing 618 mg of sulfur and 10 mL of trioctylphosphine. The seventh solution contained 4 mL of 1-dodecanethiol (DDT) and 20 mL of octadecene. The fifth solution, the sixth solution and the seventh solution were injected in sequence into the aforementioned three-necked flask, and reacted at the constant temperature of 310° C.

The zinc element raw material solution and the sulfur element raw material solution were again provided. In detail, an eighth solution is the zinc element raw material solution, containing 734 mg of zinc acetate. A ninth solution is the sulfur element raw material solution, containing 4 mL, 0.004 mol of trioctylphosphine sulfide (TOP-S). The eighth solution and the ninth solution were injected in sequence into the aforementioned three-necked flask, and reacted at the constant temperature of 310° C. Next, the solution was stirred to generate a yellow-green suspension liquid, and then the suspension liquid was cooled and precipitated using 300 mL of ethanol. The centrifugally separated product after precipitation was a green quantum dot. A peak value of an emission light emitted from the green quantum dot was 525 nm, and a FWHM thereof was 22 nm. The high-resolution (Scanning) Transmission Electron Microscope (S/TEM) (FEI Tecnai Osiris) was used to capture the image of the quantum dot as shown in FIG. 6A. Analyzed through the S/TEM, the composition, the particle size and the thickness of the shell layer of the quantum dot were obtained. The contents of elements of the quantum dot were 61.79 wt % (53.44 at %) of the zinc element, 19.06 wt % (33.60 t %) of the sulfur element, 3.54 wt % (1.78 at %) of the cadmium element, and 15.61 wt % (11.18 at %) of the selenium element, respectively. The quantum dot had the particle size of 20 nm. The thickness of the shell layer was 3.64 nm.

The quantum dots were mixed with n-hexane to form a quantum dot solution. A weight percentage of the quantum dots occupying in the quantum dot solution was 1%. Moreover, a fumed silica powder was mixed with n-hexane to prepare a carrier solution. In addition, the fumed silica was modified to be lipophilic. In the carrier solution, a weight percentage of the fumed silica was 5%.

0.05 g of the quantum dot solution and 5 g of the carrier solution were mixed and left to stand for 10 minutes. Next, the centrifugal filtration was performed to the solution containing the quantum dots and the carriers to obtain the fumed silica to which the quantum dot was attached, i.e., the carrier to which the quantum dot was attached. Next, the carrier to which the quantum dot was attached was added in 250 g of ethanol and evenly dispersed.

A solution containing an encapsulating material was provided. The solution included 0.5 g of tetraethoxysilane (TEOS) and 2.5 g of ammonia water (NH$_4$OH) having a weight percentage of 29%. The solution containing the encapsulating material was added in an ethanol solution including the carrier to which the quantum dot was attached, and the mixture was stirred under the room temperature for 4 hours to form an encapsulating layer on the surface of the carrier to which a quantum dot was attached. A pH value of the solution containing the carrier, the quantum dot, and the encapsulating layer was within a range of 10 to 11. Next, centrifugal separation was performed to the solution containing the carrier, the quantum dot, and the encapsulating layer, and then the solution was cleaned with pure water for 3 times then dried to obtain a micron-meter level luminescent material.

Embodiment 2

The manufacturing method of the quantum dot of the embodiment 2 was similar to the manufacturing method of the quantum dot of the embodiment 1. The difference between the two was only in that the embodiment 2 used the fifth solution containing 12600 mg of zinc acetate, 25.6 mL of oleic acid and 8 mL of octadecene. In the embodiment 2, the ratio (Q/R) of the weight of zinc acetate to the volume of the rest substance is 12600/(25.6+8)=375. The image of the quantum dot of embodiment 2 captured by the S/TEM is shown in FIG. 6B. Analyzed through the S/TEM, the composition, the particle size and the thickness of the shell layer of the quantum dot were obtained. The contents of elements of the quantum dot were 67.79 wt % (56.81 at %) of the zinc element, 20.99 wt % (35.87 at %) of the sulfur element, 2.23 wt % (1.08 at %) of the cadmium element, and 8.99 wt % (6.24 at %) of the selenium element, respectively. The quantum dot had the particle size of 22 nm. The thickness of the shell layer was 6.25 nm.

Comparative Example 1

Figure 6C:
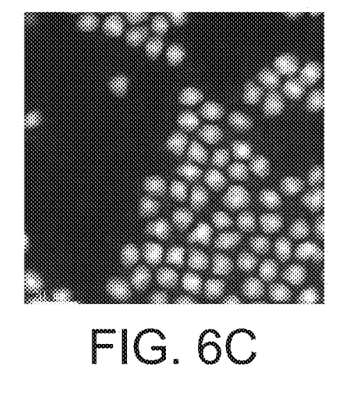
FIG. 6C is the S/TEM image of 900KX magnification of the comparative example 1 in the present disclosure.

The manufacturing method of the quantum dot of the comparative example 1 was similar to the manufacturing method of the quantum dot of the embodiment 1. The difference between the two was only in that the comparative example 1 used the fifth solution containing 1050 mg of zinc acetate, 2.13 mL of oleic acid and 8 mL of octadecene. In the comparative example, the ratio (Q/R) of the weight of zinc acetate to the volume of the rest substance is 1050/(2.13+8)=103.7. The image of the quantum dot of comparative example 1 captured by the S/TEM is shown in FIG. 6C. Analyzed through the S/TEM, the composition, the particle size and the thickness of the shell layer of the quantum dot were obtained. The contents of elements of the quantum dot were 60.53 wt % (50.14 at %) of the zinc element, 23.31 wt % (39.38 at %) of the sulfur element, 2.98 wt % (1.44 at %) of the cadmium element, and 13.18 wt % (9.04 at %) of the selenium element, respectively. The quantum dot had the particle size of 16 nm. The thickness of the shell layer was 1.22 nm.

Property Analysis

Table 1 lists the properties of the quantum dots of the embodiment 1, the embodiment 2 and the comparative example 1, comprising the particle size of the quantum dot, the thickness of the shell layer, the content ratios of the cadmium (Cd) element, the selenium (Se) element, the zinc (Zn) element and the sulfur (S) element of the quantum dot, which were measured by using the high-resolution (Scanning) Transmission Electron Microscope (S/TEM) (FEI Tecnai Osiris) (200 kV):

Particle Size of Quantum Dot

The particle size of the quantum dot was measured by using the line scan analysis of the S/TEM. The position of the single particle was selected from the image obtained through the preliminary measurement of the S/TEM. The line scan was used to obtain the distribution information of each of the elements (Cd, Se, Zn, S) of the particle, and the particle size was calculated from the element distribution information (distribution curve).

Thickness of Shell Layer

The thickness of the shell layer of the quantum dot was measured by using the line scan analysis of the S/TEM. The position of the single particle was selected from the image obtained through the preliminary measurement of the S/TEM. The line scan was used to obtain the distribution information of each of the elements (Cd, Se, Zn, S) of the particle, and the thickness of the shell layer of the particle was calculated through the difference between the distribution positions of the Zn element and the Se element.

Content Proportion of the Element Cd, Se, Zn, S

The element content proportion was measured by using the energy-dispersive x-ray spectroscopy of the S/TEM. The position of the single particle was selected from the image obtained through the preliminary measurement of the S/TEM, and the proportion of each of the elements (Cd, Se, Zn, S) in the particle was obtained by using the EDS analysis. The said proportion means the content of the each of the elements as an atomic percent calculated based on a total atomic amount of the elements Cd, Se, Zn, and S as 100 at %.

The table 1 also lists the results of the reliability test of the micron-meter level luminescent materials of the embodiment 1, the embodiment 2 and the comparative example 1. In the test method, the initial luminance of a QD LED package, formed by forming a gel mass by mixing the micron-meter level luminescent material with a silicone gel used for encapsulating a LED, using the gel mass to encapsulate a LED element of model PKG5630, and then curing the silicone gel of the gel mass, was measured. Next, the reliability (RA) experiment was performed to the QD LED package after the initial luminance measurement by turning on the QD LED package to emit light and placing the QD LED package in a condition having a temperature of 85° C. and a humidity of 85% for 168 hours. Then, the luminance after the RA experiment of the QD LED package was measured. In the table 1, Δ indicates the luminance after the RA experiment is 30-60% of the initial luminance; ○ indicates the luminance after the RA experiment is 60-80% of the initial luminance; ⊚ indicates the luminance after the RA experiment is >80% of the initial luminance.

TABLE 1

|  | comparative example 1 | embodiment 1 | embodiment 2 |
| --- | --- | --- | --- |
| thickness of shell layer (nm) | 1.22 | 3.64 | 6.25 |
| particle size of quantum dot (nm) | 16 | 20 | 22 |
| Zn element content (at %) | 50.14 | 53.44 | 56.81 |
| S element content (at %) | 39.38 | 33.6 | 35.87 |
| Cd element content (at %) | 1.44 | 1.78 | 1.08 |
| Se element content (at %) | 9.04 | 11.18 | 6.24 |
| ratio of Zn/S | 1.27 | 1.59 | 1.58 |
| ratio of Cd/Se | 0.16 | 0.16 | 0.17 |
| reliability | Δ | ⊚ | ○ |

From the values of the particle size of the quantum dot, the thickness of the shell layer and so on in the table 1, it can be known the different thicknesses of the shell layers of the embodiment 1, the embodiment 2 and the comparative example 1 may be obtained by adjusting the additive amount of zinc acetate and oleic acid in the fifth solution. From the images of the quantum dot particles of the embodiment 1, the embodiment 2 and the comparative example 1 respectively shown in FIG. 6A and FIG. 6B obtained by using the S/TEM, it can be known the thicknesses of the shell layers of the quantum dots of the embodiment 1 and the embodiment 2 are larger than that of the comparative example 1, and the outer shell layer of each of the embodiment 1 and the embodiment 2 has a structure of the secondary particle formed by agglutinating particles for the shell layer free in the solution, and exhibits an irregular lava rock construction, or an irregular flocculent structure. On the contrary, from the S/TEM image of the comparative example 1, it can be known the outer portion of the quantum dot particle of the comparative example 1 has no secondary particle, and therefore is more even. It could be realized that when the thickness of the shell layer increases, and the shell layer of the outer layer is going to be stacked, the particles for the shell layer tend to form the primary particle (e.g. 121q), and then the primary particles conjoin to form the secondary particle (e.g. 121Q), and therefore the outer portions of the quantum dots of the embodiment 1 and the embodiment 2 exhibit a stereoscopic irregular polygon shape having different lengths on each side of which, such as an appearance of a lava rock construction, or a flocculent structure. From the results listed in the table 1, it can be known the micron-meter level luminescent materials of the embodiment 1 and the embodiment 2 have the better reliability, and it can prove the reliability of the quantum dot can be improved by increasing the thickness of the shell layer in the quantum dot, for example, by having the zinc element in the content range of 51 at %-64 at %, the sulfur element in the content range of 32 at %-38 at %, or the shell layer having the thickness of 2 nm-8 nm, and therefore the micron-meter level luminescent material having the quantum dot can also have the better reliability.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A quantum dot, comprising:
a core being at least one selected from the group consisting of a XII-XV group compound semiconductor nano-crystal, a XII-XVI group compound semiconductor nano-crystal, a XIII-XV group compound semiconductor nano-crystal and a XIII-XVI group compound semiconductor nano-crystal, wherein the core contains a cadmium element and a selenium element; and
a shell layer containing a zinc element and a sulfur element, and enclosing the core, wherein based on a total content of the cadmium element, the selenium element, the zinc element and the sulfur element of the quantum dot, a content of the zinc element is in a range of 51 at %-64 at %, a content of the sulfur element is in a range of 32 at %-38 at %.

2. The quantum dot according to claim 1, wherein in the quantum dot, a content ratio of the zinc element to the sulfur element is in a range of 1.34-2.

3. The quantum dot according to claim 1, wherein based on the total content of the cadmium element, the selenium element, the zinc element and the sulfur element of the quantum dot, a content of the cadmium element is in a range of 0.5 at %-5 at %, a content of the selenium element is in a range of 3 at %-16 at %.

4. The quantum dot according to claim 1, wherein the shell layer has a thickness of 2 nm-8 nm.

5. The quantum dot according to claim 1, wherein the shell layer comprises a secondary particle formed by conjoining primary particles.

6. The quantum dot according to claim 1, wherein the shell layer has an irregular concave-convex outer surface.

7. A luminescent material, comprising the quantum dot according to claim 1.

8. A light-emitting element, comprising:
a light source; and
an encapsulating material comprising the luminescent material according to claim 7, wherein the encapsulating material covers the light source.

9. A display device, comprising the light-emitting element according to claim 8, wherein the display device is at least one selected from the group consisting of a television, a digital photo camera, a digital video camera, a digital photo frame, a mobile phone, a notebook, a mobile computer, a computer screen, a portable game console, a portable information terminal, a portable audio player, a game console, a car display and a wearable device.

10. A quantum dot, comprising:
a core being at least one selected from the group consisting of a XII-XV group compound semiconductor nano-crystal, a XII-XVI group compound semiconductor nano-crystal, a XIII-XV group compound semiconductor nano-crystal and a XIII-XVI group compound semiconductor nano-crystal; and
a shell layer containing a zinc element and a sulfur element, and enclosing the core, wherein the core and the shell layer have a core-shell element, based on a total content of the core-shell element, a content of a zinc element of the core-shell element is in a range of 51 at %-64 at %, a content of a sulfur element of the core-shell element is in a range of 32 at %-38 at %.

11. The quantum dot according to claim 10, wherein the core-shell element further comprises a cadmium element and a selenium element, based on a total content of the cadmium element, the selenium element, the zinc element and the sulfur element of the core-shell element, a content of the cadmium element is in a range of 0.5 at %-5 at %, a content of the selenium element is in a range of 3 at %-16 at %.

12. The quantum dot according to claim 10, wherein in the quantum dot, a content ratio of the zinc element to the sulfur element is in a range of 1.34-2.

13. The quantum dot according to claim 10, wherein the shell layer has a thickness of 2 nm-8 nm.

14. The quantum dot according to claim 10, wherein the shell layer comprises a secondary particle formed by conjoining primary particles.

15. The quantum dot according to claim 10, wherein the shell layer has an irregular concave-convex outer surface.

16. A light-emitting element, comprising:
a light source; and
an encapsulating material comprising a luminescent material, comprising the quantum dot according to claim 10, wherein the encapsulating material covers the light source.

17. A display device, comprising the light-emitting element according to claim 16, wherein the display device is at least one selected from the group consisting of a television, a digital photo camera, a digital video camera, a digital photo frame, a mobile phone, a notebook, a mobile computer, a computer screen, a portable game console, a portable information terminal, a portable audio player, a game console, a car display and a wearable device.

18. A method for manufacturing a quantum dot, comprising:
providing a core-shell solution, wherein the core-shell solution contains a core, the core is at least one selected from the group consisting of a XII-XV group compound semiconductor nano-crystal, a XII-XVI group compound semiconductor nano-crystal, a XIII-XV group compound semiconductor nano-crystal and a XIII-XVI group compound semiconductor nano-crystal;
providing a zinc element raw material solution, wherein the zinc element raw material solution has zinc acetate and a rest substance, the zinc acetate has a weight of Q mg, the rest substance has a volume of R mL, Q/R=150-400;
providing a sulfur element raw material solution; and
mixing the core-shell solution, the zinc element raw material solution, and the sulfur element raw material solution.

19. The method for manufacturing the quantum dot according to claim 18, wherein the rest substance of the zinc element raw material solution comprises oleate and octadecene.

20. The method for manufacturing the quantum dot according to claim 18, which is used for manufacturing the quantum dot according to claim 1.

* * * * *